United States Patent
Kim et al.

(10) Patent No.: US 7,480,845 B2
(45) Date of Patent: Jan. 20, 2009

(54) METHOD AND APPARATUS FOR GENERATING BLOCK-BASED LOW-DENSITY PARITY CHECK MATRIX AND RECORDING MEDIUM HAVING RECORDED THEREON CODE FOR IMPLEMENTING THE METHOD

(75) Inventors: Hyun-jung Kim, Suwon-si (KR); Joo-ho Kim, Yongin-si (KR); Kyung-geun Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 401 days.

(21) Appl. No.: 11/298,825

(22) Filed: Dec. 12, 2005

(65) Prior Publication Data

US 2006/0236191 A1    Oct. 19, 2006

(30) Foreign Application Priority Data

Apr. 13, 2005    (KR) ...................... 10-2005-0030741

(51) Int. Cl.
*H03M 13/00*    (2006.01)
(52) U.S. Cl. ..................................... 714/752
(58) Field of Classification Search .................. 714/752
See application file for complete search history.

(56) References Cited

U.S. PATENT DOCUMENTS 6,950,461 B2 *   9/2005   Goldstein et al. ............ 375/222
7,178,085 B2 *   2/2007   Chae et al. ................... 714/758
2005/0050435 A1   3/2005   Kyung et al.
2005/0246611 A1 * 11/2005   Jin et al. ..................... 714/754
2006/0053359 A1   3/2006   Chae et al.

(Continued)

FOREIGN PATENT DOCUMENTS

EP    1 528 686 A1    10/2004

(Continued)

OTHER PUBLICATIONS

D. J. Mackay, "Good Error-Correction Codes Based on Very Sparse Matrices", IEEE Trans. on Information Theory, vol. 45, No. 2, pp. 399-431, 1999.

(Continued)

*Primary Examiner*—M. Mujtaba K Chaudry
*Assistant Examiner*—Sam Rizk
(74) *Attorney, Agent, or Firm*—Stein, McEwen & Bui, LLP (57) ABSTRACT

A method of and an apparatus for generating a block-based low density parity check (LDPC) matrix, where calculation of an inverse matrix is not necessary and back-substitution is possible over the entire matrix area, and a recording medium having recorded thereon code for implementing the method. An area of the LDPC matrix is vertically divided based on respective lengths of first and second parity bit vectors and, a block-based matrix is generated such that a double diagonal matrix is arranged in an upper portion of an area corresponding to the second parity bit vector among areas into which the LDPC matrix is vertically divided., The area of the LDPC matrix is horizontally divided based on a position of the double diagonal matrix, and block-based matrices are generated in the divided areas of the LDPC matrix, to satisfy a condition that column weights (Wc) are uniform.

21 Claims, 11 Drawing Sheets

U.S. PATENT DOCUMENTS

2006/0242534 A1* 10/2006 Livshitz ................. 714/758

FOREIGN PATENT DOCUMENTS

| WO | WO 2004/047019 A2 | 6/2004 |
| WO | WO 2005/020500 A1 | 3/2005 |

OTHER PUBLICATIONS

T.J. Richardson et al., "Efficient Encoding of Low-Density Parity Check Codes," IEEE Transactions on Information Theory, vol. 47, No. 2, pp. 638-656, 2001.

Search Report issued in Korean Patent Application No. 2006-1244 issued on Jul. 18, 2006.

Written Opinion issued in Korean Patent Application No. 2006-1244 issued on Jul. 18, 2006.

Reference AA (US 2006/0053359 A1) is substantially equivalent to Reference AH (WO 2004/047019 A2).

Reference AB (US 2005/0050435 A1) is substantially equivalent to Reference AI (WO 2005/020500 A1).

* cited by examiner

FIG. 1

(PRIOR ART)

FIG. 2

(PRIOR ART)

METHOD AND APPARATUS FOR GENERATING BLOCK-BASED LOW-DENSITY PARITY CHECK MATRIX AND RECORDING MEDIUM HAVING RECORDED THEREON CODE FOR IMPLEMENTING THE METHOD

CROSS-REFERENCE TO RELATED APPLICATION

This application claims the benefit of Korean Patent Application No. 2005-30741, filed on Apr. 13, 2005, in the Korean Intellectual Property Office, the disclosure of which is incorporated herein by reference.

BACKGROUND OF THE INVENTION

1. Field of the Invention

Aspects of the present invention relate to a method of and an apparatus for generating a parity check matrix, and more particularly, to a method of and an apparatus for generating a block-based low-density parity check (LDPC) matrix, which facilitates parity bit generation.

2. Description of the Related Art

To generate additional information for error correction, an LDPC coding method is widely used. The LDPC coding involves generating parity bits using an LDPC matrix H having 0s and 1s, in which a number of 1s is far less than a number of 0s.

The number of 1s included in each row or column of a parity check matrix is referred to as a row degree or a column degree. A regular parity check matrix indicates a parity check matrix in which row degrees of all the rows are the same or column degrees of all the columns are the same. An irregular parity check matrix indicates a parity check matrix in which row degrees of all the rows are not the same or column degrees of all the columns are not the same. In a regular parity check matrix, a row degree is referred to as a row weight (Wr) and a column degree is referred to as a column weight (Wc).

The generation of parity bits using LDPC coding is performed according to equation 1.

$$HX=0 \quad (1)$$

In equation 1, H represents a parity check matrix of m*n and X represents a codeword matrix of n*1, wherein X is composed of a message data vector S having a length of (n−m) and a parity bit vector P having a length of m. Thus, a sum of the length (n−m) of the message data vector S and the length (m) of the parity bit vector P is equal to n.

A concept of LDPC coding has been disclosed by D. J. MacKay in "Good Error-Correction Codes Based on Very Sparse Matrices" (IEEE Trans. on Information Theory, vol. 45, no.2, pp. 399-431, 1999). According to Mackay, parity bits can be generated by calculating Equation 1 using a matrix operation such as Gaussian elimination. However, in the case of LDPC coding, since a code length is large and the size of the parity check matrix H is also large, encoding using Gaussian elimination requires very complicated computation.

Figure 1:
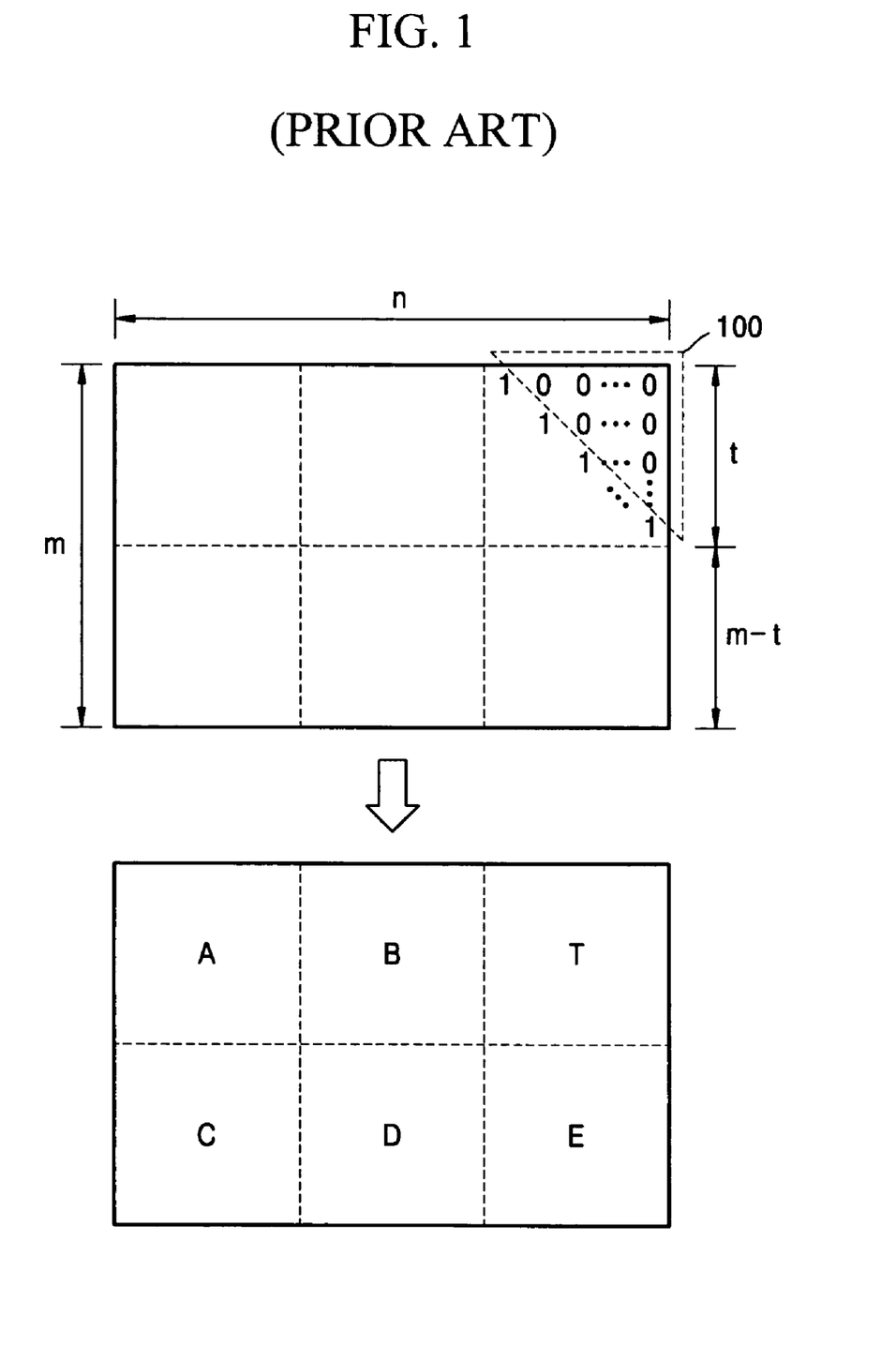
FIG. 1 illustrates a format of a parity check matrix that is transformed through a Richardson method.

To solve the problem, an efficient coding method for transforming a parity check matrix into another format has been developed by T. J. Richardson and is referred to as a Richardson method. FIG. 1 illustrates a format of a parity check matrix that is transformed through the Richardson method.

According to the Richardson method, the parity check matrix H is transformed into a transformed parity check matrix H' through row interchange and column interchange. After the transformation, a top right corner portion 100 of the transformed parity check matrix H' should be composed of only 0s, as shown in FIG. 1. In other words, the transformed parity check matrix H' is composed of areas A, B, C, D, E, and T, and the top right corner portion 100 of the area T is composed of only 0s.

According to the Richardson method, since t elements of the top right corner portion 100 of the transformed parity check matrix H' all are 0s, t parity bits can be easily obtained through back substitution, facilitating a generation of parity information. However, to obtain (m−t) parity bits, inverse matrix calculation is required. The remaining (m−t) parity bits can be obtained as follows.

Equation 1 is transformed into Equation 2 using the Richardson method.

$$Hx = H'x = \begin{bmatrix} A & B & T \\ C & D & E \end{bmatrix} \begin{bmatrix} S \\ P_1 \\ P_2 \end{bmatrix} \quad (2)$$

In Equation 2, S represents a message data vector and $P_1$ and $P_2$ represent a first parity bit vector and a second parity bit vector, respectively. Equation 2 is expressed as matrix equations 3 and 4.

$$AS+BP_1+TP_2=0, \ CS+DP_1+EP_2=0 \quad (3)$$

$$(-ET^{-1}A+C)S+(-ET^{-1}B+D)P_1=(-ET^{-1}A+C)S+\phi P_1=0 \quad (4)$$

In equations (3) and (4), a Richardson matrix $\phi=(-ET^{-1}B+D)$. By combining Equations 3 and 4, the first parity bit vector $P_1$ and the second parity bit vector $P_2$ can be defined in Equations 5 and 6, respectively.

$$P_1=-(-ET^{-1}B+D)^{-1}(-ET^{-1}A+C)S=-\phi^{-1}(-ET^{-1}A+C)S \quad (5)$$

$$P_2=-T^{-1}(AS+BP_1) \quad (6)$$

According to the Richardson method, although t parity bits can be easily obtained through back substitution, since an inverse matrix, i.e., $\phi^{-1}$, needs to be calculated to obtain the remaining (m−t) parity bits, parity bit generation is not easy. A more thorough discussion of the Richardson Method may be found in an article entitled "Efficient Encoding of Low-Density Parity Check Codes," Thomas J. Richardson and Rudiger L. Urbanke, IEEE Transactions on Information Theory, Vol. 47, No. 2, pp. 638-656, 2001.

Figure 2:
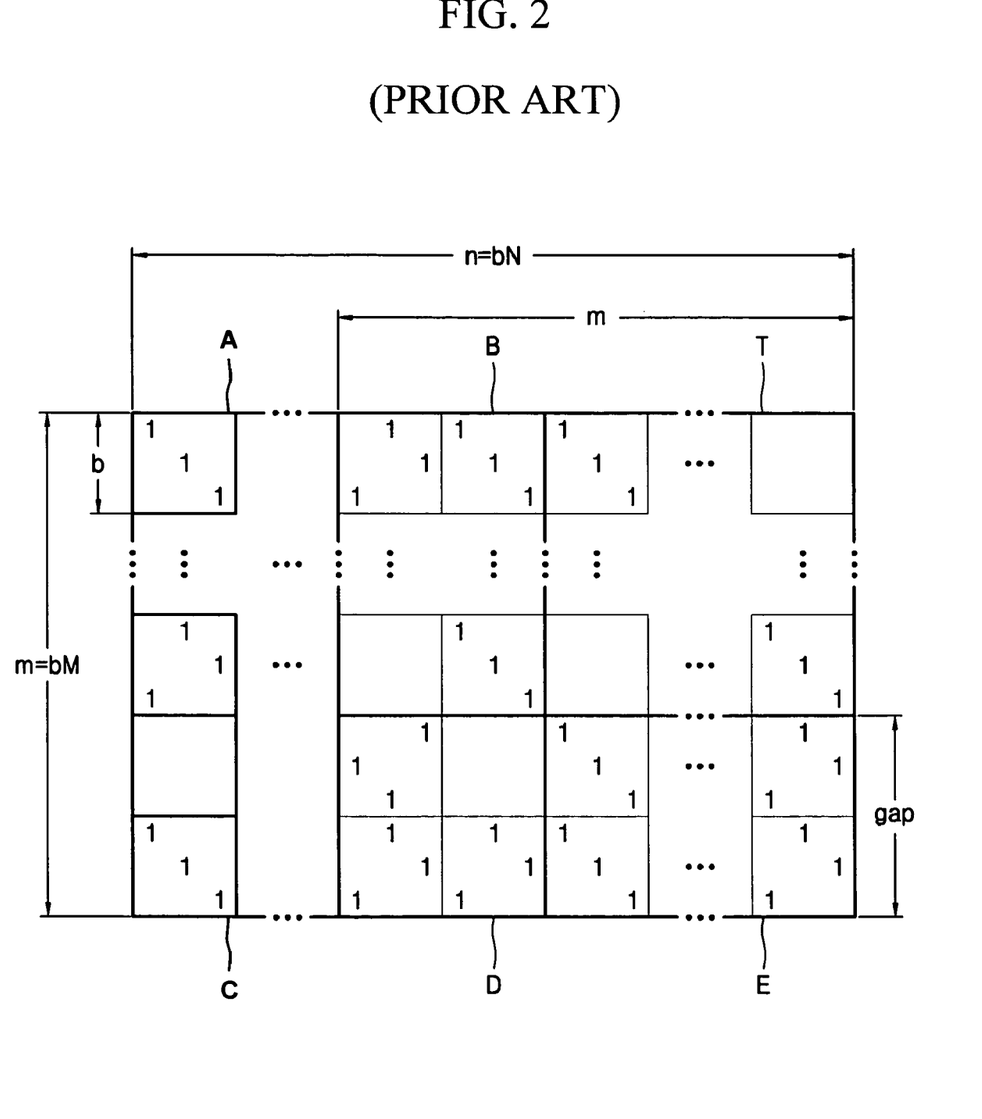
FIG. 2 illustrates a conventional block-based LDPC matrix.

FIG. 2 illustrates a conventional block based LDPC matrix based on blocks b, each having a predetermined number of 1s in each column and each row. In FIG. 2, one diagonal matrix is formed in an area T using unit matrix blocks, and unit matrix blocks and shift matrix blocks are arranged randomly in areas A, C, B, D, and E.

Thus, parity bits corresponding to blocks included in the area T may be easily obtained through back-substitution. However, since unit matrix blocks and shift matrix blocks are arranged randomly in the area E defined as a gap, an inverse matrix $\phi^{-1}$ still needs to be calculated to obtain parity bits corresponding to blocks of the areas E and D, making parity bit generation difficult.

SUMMARY OF THE INVENTION

An aspect of the present invention provides a method and apparatus for generating a block-based LDPC matrix, in which the calculation of an inverse matrix is not necessary and back-substitution is possible over the entire matrix area, and a recording medium having recorded thereon a program for implementing the method.

According to an aspect of the present invention, there is provided a method for generating a block-based low density parity check (LDPC) matrix. The method comprises vertically dividing an area for the LDPC matrix based on a length of a first parity bit vector and a length of a second parity bit vector, generating a block-based matrix such that a double diagonal matrix is arranged in an upper portion of an area corresponding to the second parity bit vector among areas that the LDPC matrix is vertically divided into, horizontally dividing the area for the LDPC matrix based on the position of the double diagonal matrix, and generating block-based matrices in areas that the LDPC matrix is horizontally and vertically divided into, to satisfy a condition that column weights (Wc) are uniform.

According to another aspect of the present invention, there is provided an apparatus for generating a block-based low density parity check (LDPC) matrix. The apparatus comprises a first area dividing unit, a double diagonal matrix block generating unit, a second area dividing unit, and a block-based matrix generating unit. The first area dividing unit vertically divides an area for the LDPC matrix based on a length of a first parity bit vector and a length of a second parity bit vector. The double diagonal matrix block generating unit generates a block-based matrix such that a double diagonal matrix is arranged in an upper portion of an area corresponding to the second parity bit vector among areas that the LDPC matrix is vertically divided into. The second area dividing unit horizontally divides the area for the LDPC matrix based on the position of the double diagonal matrix. The block-based matrix generating unit generates block-based matrices in areas that the LDPC matrix is horizontally and vertically divided into, to satisfy a condition that column weights (Wc) are uniform.

According to still another aspect of the present invention, there is provided a computer-readable recording medium having recorded thereon code for implementing a method for generating a block-based low density parity check (LDPC) matrix. The method comprises vertically dividing an area for the LDPC matrix based on a length of a first parity bit vector and a length of a second parity bit vector, generating a block-based matrix such that a double diagonal matrix is arranged in an upper portion of an area corresponding to the second parity bit vector among areas that the LDPC matrix is vertically divided into, horizontally dividing the area for the LDPC matrix based on the position of the double diagonal matrix, and generating block-based matrices in areas that the LDPC matrix is horizontally and vertically divided into, to satisfy a condition that column weights (Wc) are uniform.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3:
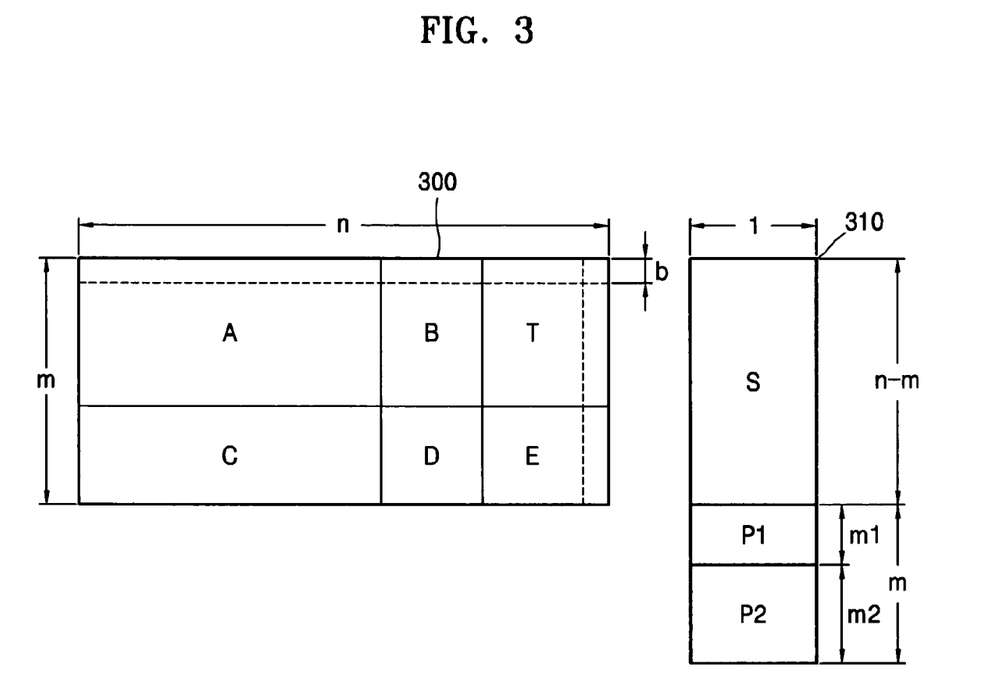
FIG. 3 shows concepts of a block-based LDPC matrix H' and a codeword vector x in LDPC coding or decoding.

FIG. 3 illustrates a block-based LDPC matrix H' 300 and a codeword vector x 310 in a parity check equation defined by Equation 2, in block-based LDPC coding or decoding.

Referring to FIG. 3, the LDPC matrix H' 300 has a size of m*n, and the codeword vector x 310 has a size of n*1. The codeword vector x 310 is composed of a message data vector S having a length of (n−m), a first parity bit vector $P_1$ having a length of m1, and a second parity bit vector $P_2$ having a length of m2. Thus, a sum of the length (n−m) of the message data vector S, the length m1 of the first parity bit vector $P_1$, and the length m2 of the second parity bit vector $P_2$ is equal to n, and a sum of m1 and m2 is equal to m. Areas A, C, B, D, T, and E of the LDPC matrix H' 300 may be determined by the length (n−m) of the message data vector S, the length (m1) of the first parity bit vector $P_1$, and the length (m2) of the second parity bit vector $P_2$, as explained in more detail below.

Figure 4:
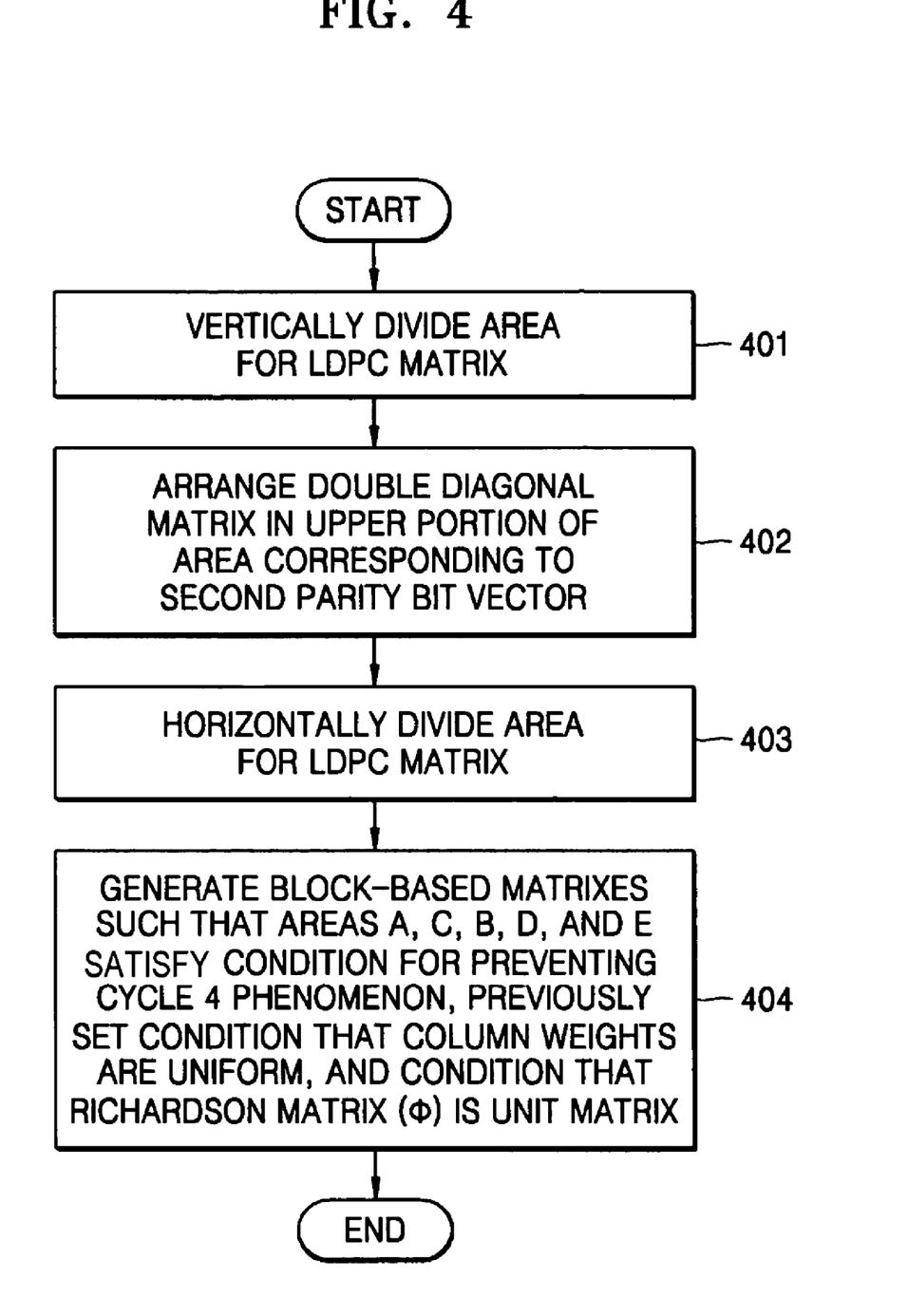
FIG. 4 is a flowchart illustrating a method for generating a block-based LDPC matrix according to an aspect of the present invention.
Figure 5A:
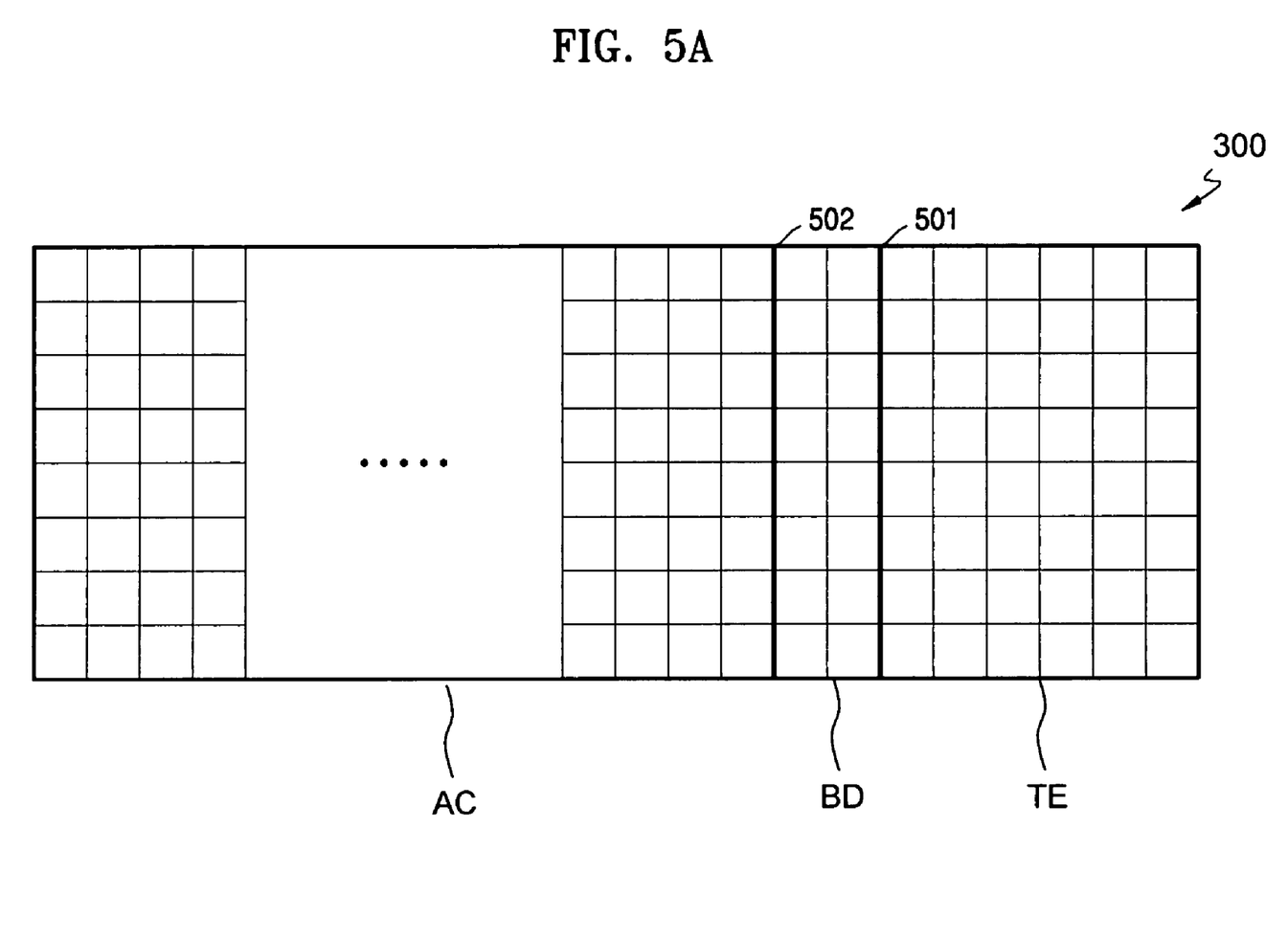
FIGS. 5A through 5D are views for explaining a process of generating a block-based LDPC matrix according to an embodiment of the present invention.

FIG. 4 is a flowchart illustrating a method for generating a block-based LDPC matrix according to an embodiment of the present invention. Referring to FIG. 4, in operation 401, the LDPC matrix H' 300 is vertically divided based on the length m1 of the first parity bit vector $P_1$ and the length m2 of the second parity bit vector $P_2$ illustrated in FIG. 3. Thus, the LDPC matrix H' 300 of FIG. 3 is vertically divided at points 501 and 502 into three areas AC, BD, and TE, which are horizontally adjacent, as illustrated in FIG. 5A. The position of the point 501 is determined by the length m2 of the second parity bit vector $P_2$ and the position of the point 502 is determined by the length m1 of the first parity bit vector $P_1$. However, the position of the point 501 may be determined by one of the length m1 of the first parity bit vector $P_1$ and the length m2 of the second parity bit vector $P_2$, and the position of the point 502 may be determined by one of the length m1 of the first parity bit vector $P_1$ and the length (n−m) of the message data vector S.

Figure 5B:
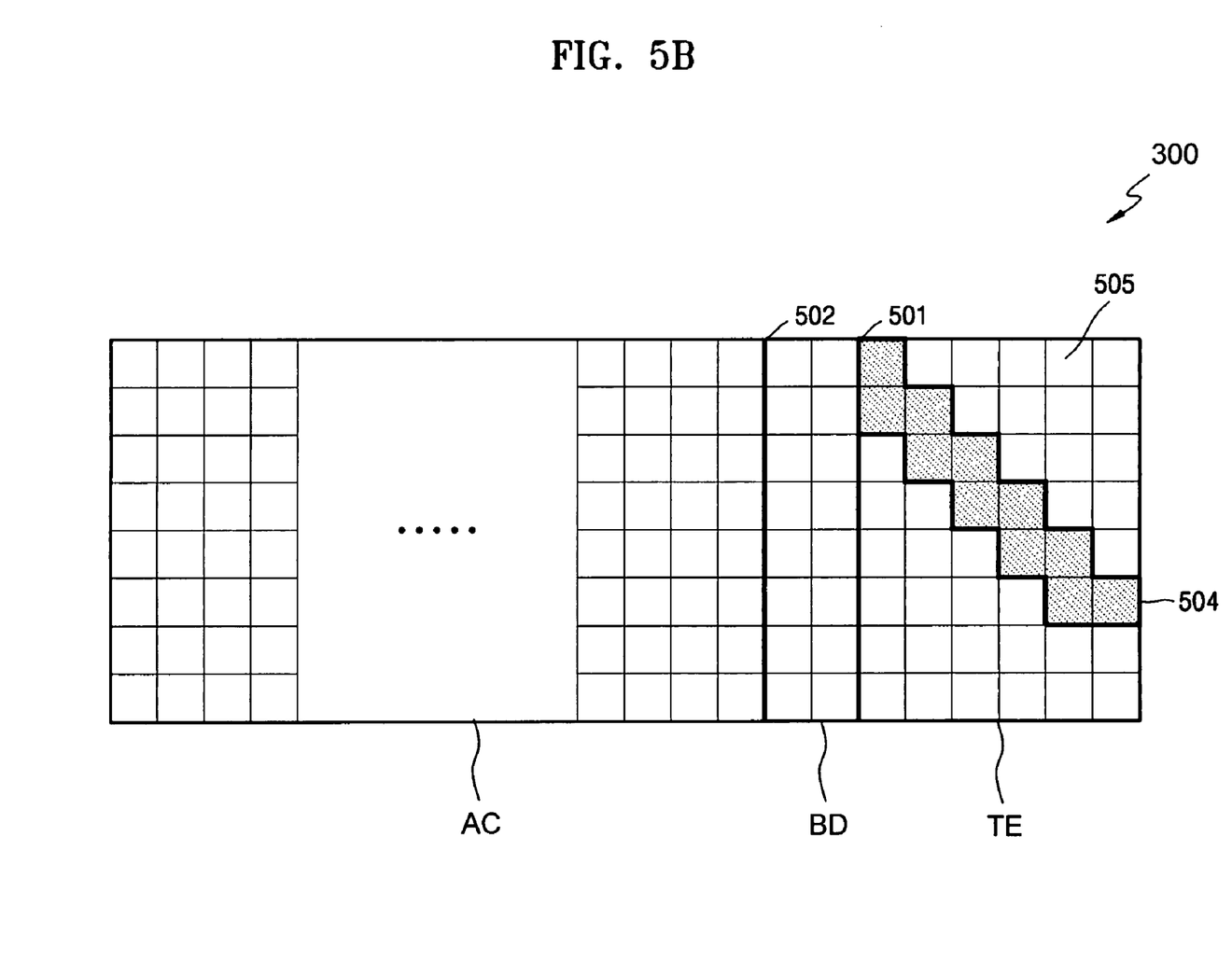

A block-based matrix is generated such that a double diagonal matrix 504 is arranged in an upper portion of the area TE corresponding to the length of the second parity bit vector $P_2$ in operation 402, as illustrated in FIG. 5B. At this time, all the blocks included in an upper portion 505 of the area TE with respect to the double diagonal matrix 504 are zero matrix blocks. The double diagonal matrix 504 may be generated using unit matrix blocks. However, the double diagonal matrix 504 may be generated such that unit matrix blocks are disposed in an upper portion of the double diagonal matrix 504 and shift matrix blocks are disposed in a lower portion of the double diagonal matrix 504.

Figure 5C:
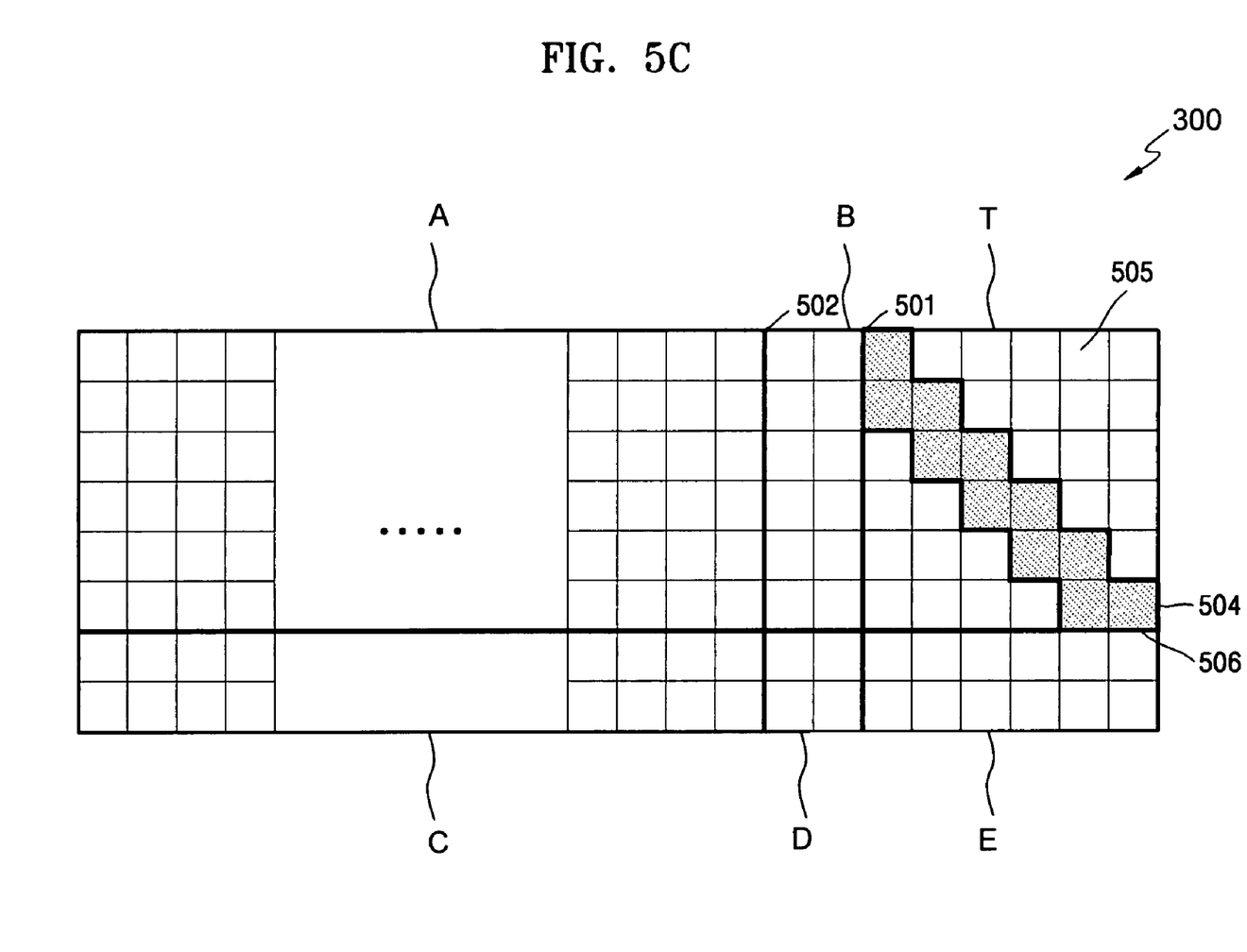

In operation 403, the LDPC matrix H' 300 is horizontally divided at a point 506 based on the position of the double diagonal matrix 504 generated in operation 402, as illustrated in FIG. 5C. As a result, as illustrated in FIG. 3, the LDPC matrix H' 300 is divided into the areas A and C corresponding to the message data vector S, the areas B and D corresponding to the first parity bit vector $P_1$, and the areas T and E corresponding to the second parity bit vector $P_2$. The area A may be defined as an upper portion corresponding to the message data vector S and the area C may be defined as a lower portion corresponding to the message data vector S. The area B may be defined as an upper portion corresponding to the first parity bit vector $P_1$ and the area D may be defined as a lower portion corresponding to the first parity bit vector $P_1$. The area T may be defined as an upper portion corresponding to the second parity bit vector $P_2$ and the area E may be defined as a lower portion corresponding to the second parity bit vector $P_2$.

Once the LDPC matrix H' 300 is divided into the six areas, A, C, B, D, T and E, block-based matrices are generated such that the areas A, C, B, D, and E satisfy a condition for preventing a cycle 4 phenomenon, a condition that column weights (Wc) are uniform, and a condition that a Richardson matrix ($\phi$) is a unit matrix in operation 404.

Figure 5D:
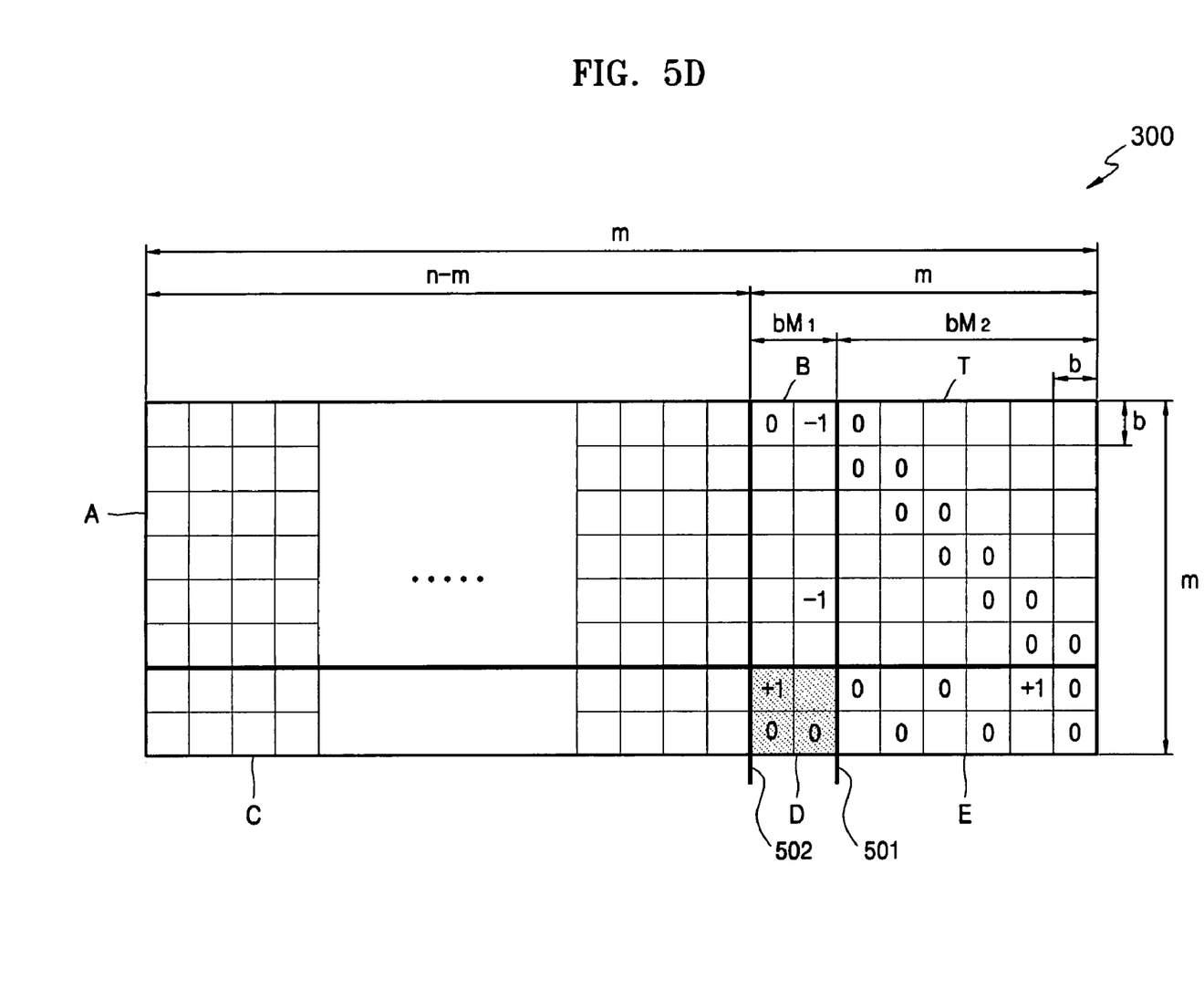
Figure 6:
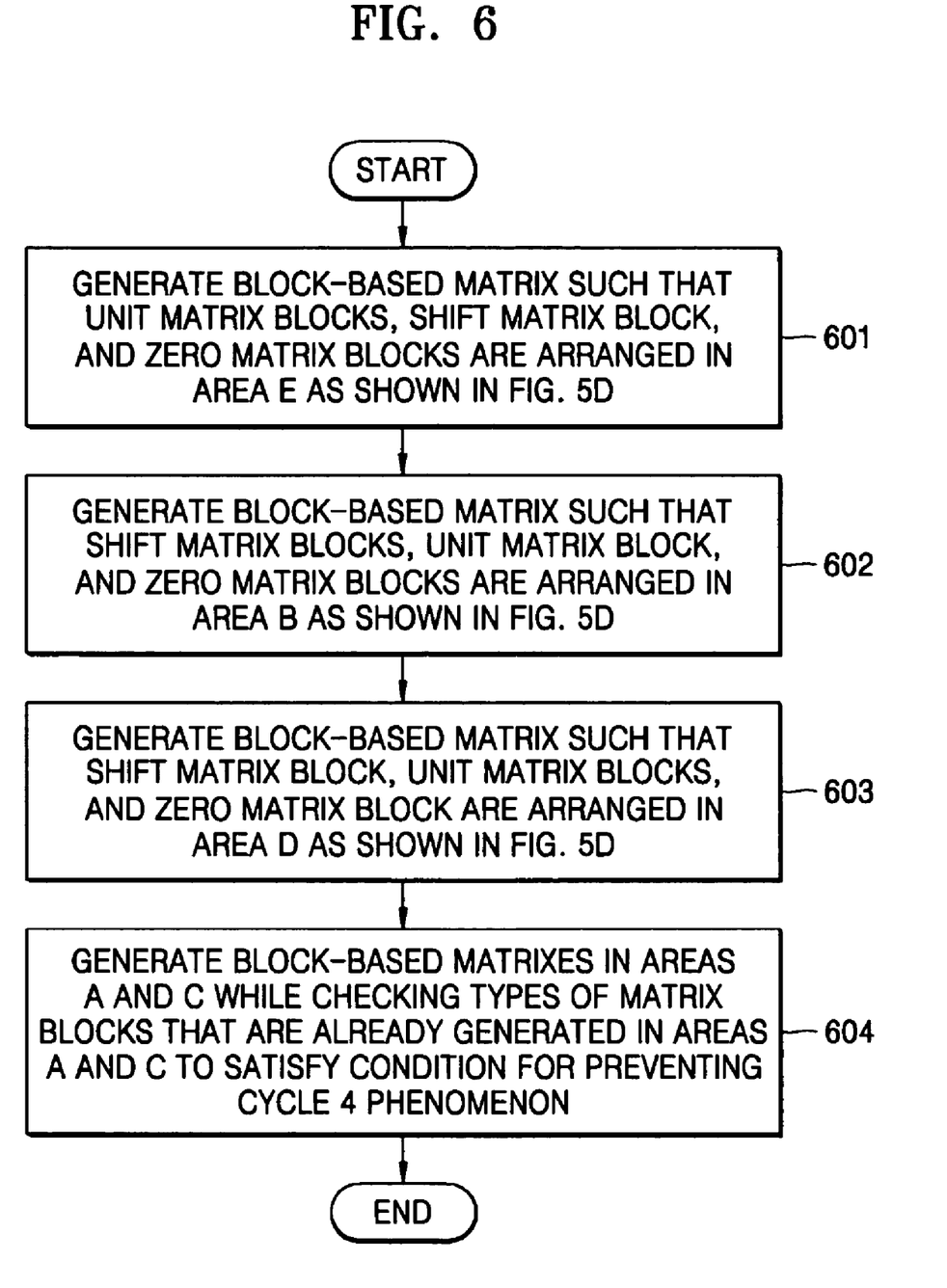
FIG. 6 is a detailed flowchart illustrating operation 404 of FIG. 4.

FIG. 6 is a detailed flowchart illustrating operation 404 of FIG. 4. Hereinafter, a process of generating block-based matrices in the areas A, C, B, D, and E of the LDPC matrix H' will be described with reference to FIGS. 5D and 6. In the areas B, D, E, and T of FIG. 5D, "0" indicates a unit matrix block that is not shifted; "−1" indicates a "−1 negative" shift matrix block; "+1" indicates a "+1 positive" shift matrix block; and an unmarked marked block indicates a zero matrix block.

Figure 8:
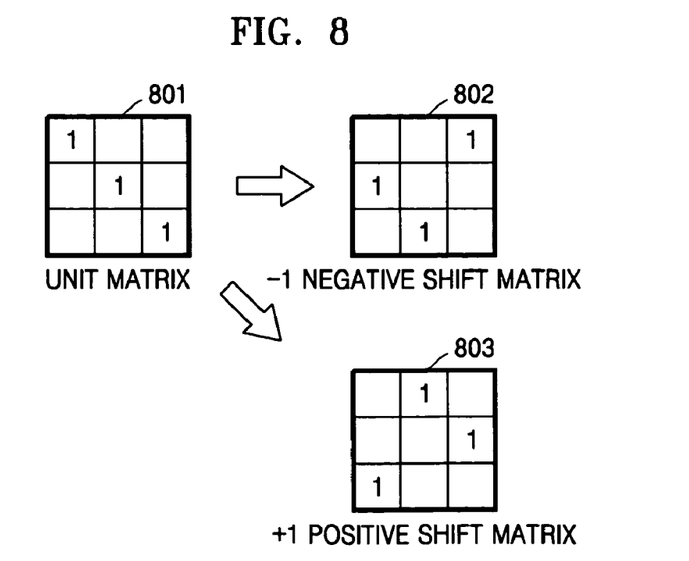
FIG. 8 illustrates a unit matrix block, a +1 positive shift matrix block, and a −1 negative shift matrix block.

In operation 601, a block-based matrix is generated such that unit matrix blocks, a shift matrix block, and zero matrix blocks are arranged in the area E as illustrated in FIG. 5D. As can be seen from the area E illustrated in FIG. 5D, a block-based matrix is generated such that unit matrix blocks are disposed in the right-most block-based column and one of a unit matrix block and a shift matrix block and a zero matrix block alternate vertically and horizontally in an area except for the right-most block-based column. The shift matrix block used in the area E is a +1 positive shift matrix block. Referring to FIG. 8, the +1 positive shift matrix block is obtained by shifting each 1 included in a unit matrix 801 to the right by 1 block as shown in a +1 positive shift matrix block 803.

In operation 602, a block-based matrix is generated such that shift matrix blocks, a unit matrix block, and zero matrix blocks are arranged in the area B as illustrated in FIG. 5D. In other words, the unit matrix block and a shift matrix block alternate horizontally in the topmost block-based row and a shift matrix block is disposed in a predetermined position of a column that contains the shift matrix block in the top-most block-based row. The predetermined position in the area B corresponds to a position of a block that is immediately above the bottom-most block of the area B. The shift matrix block used in the area B is a −1 negative shift matrix block. Referring to FIG. 8, the −1 negative shift matrix block is obtained by shifting each 1 included in a unit matrix 801 to the left by 1 block as shown in a −1 negative shift matrix block 802.

In operation 603, a block-based matrix is generated such that a shift matrix block, unit matrix blocks, and a zero matrix block are arranged in the area D as illustrated in FIG. 5D. In other words, the block-based matrix is generated such that the unit matrix blocks are disposed in the bottom-most row and the shift matrix block is disposed in a block that is immediately above the left-most block in the bottom-most row. The shift matrix block used in the area D is the +1 positive shift matrix block.

Figure 7:
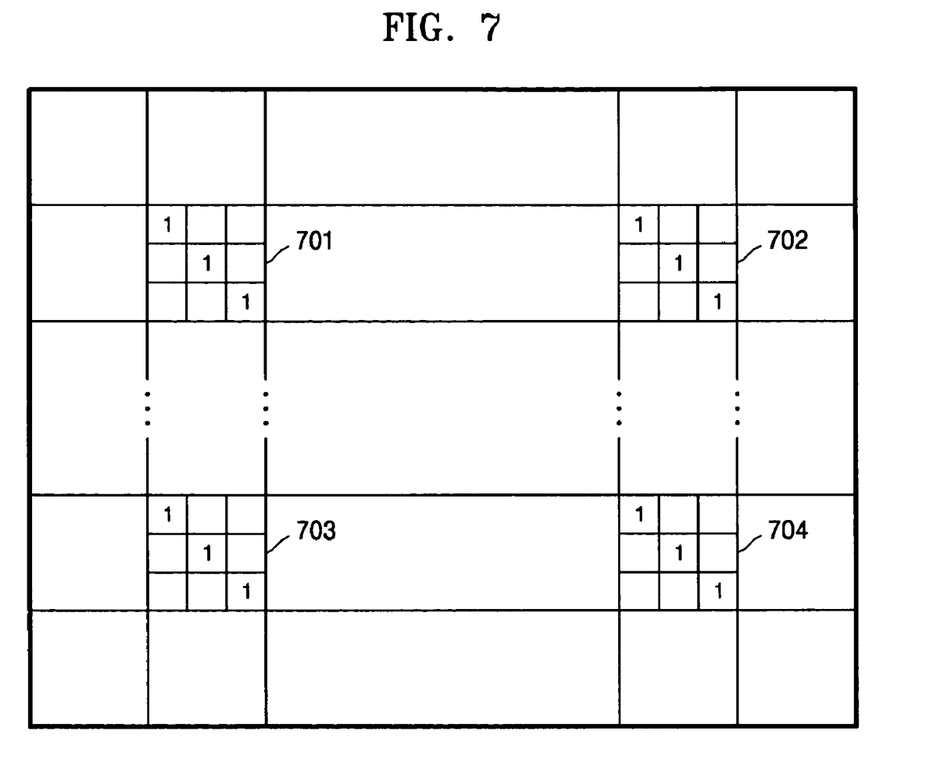
FIG. 7 illustrates a parity check matrix that generates a cycle 4 phenomenon.

In operation 604, block-based matrices are sequentially generated in the areas A and C while types of matrix blocks that are already generated in the areas A and C are checked to satisfy the condition for preventing the cycle 4 phenomenon. The condition for preventing the cycle 4 phenomenon is to dispose block-based matrices to prevent positions of unit matrix blocks 701, 702, 703, and 704 from forming a square as illustrated in FIG. 7. If the cycle 4 phenomenon occurs, normal parity bit check coding and decoding cannot be performed. For example, if the position of the unit matrix block 701 corresponds to a (2, 2) block, the position of the unit matrix block 702 may correspond to a (2, 8) block, the position of the unit matrix block 703 may correspond to a (4, 2) block, and the position of the unit matrix block 704 may correspond to a (4, 8) block.

An order of generating block-based matrices for the areas E, B, and D in FIG. 6 may be changed. The positions of zero matrices, unit matrices, and shift matrices are predetermined to satisfy the condition for preventing the cycle 4 phenomenon, the condition that the Richardson matrix $\phi$ is a unit matrix, and the condition that column weights (Wc) are uniform.

In addition, block-based matrices are generated in the areas A and C such that column weights (Wc) in a parity check matrix are the same as each other. The generation of the block-based matrices in the areas A and C is performed after the generation of block-based matrices in the areas B, D, E, and T. In the example shown in FIG. 5D, the column weight (Wc) is 3. Shift matrix blocks used in the areas B, D, E, and T may be +P positive shift matrix blocks or −P shift matrix blocks. The +P positive shift matrix block is obtained by shifting each 1 included in a unit matrix to the right by P points. The −P shift matrix block is obtained by shifting each 1 included in a unit matrix to the left by P points.

Thus, a block-based LDPC matrix as illustrated in FIG. 5D is generated. In the areas B, D, E, and T of FIG. 5D, 0 indicates a unit matrix block that is not shifted, −1 indicates a −1 negative shift matrix block, and +1 indicates a +1 positive shift matrix block. In FIG. 5D, $bM_1=m1$, $bM_2=m2$, and b indicates a length of one block. A non-marked block indicates a zero matrix block.

Figure 9:
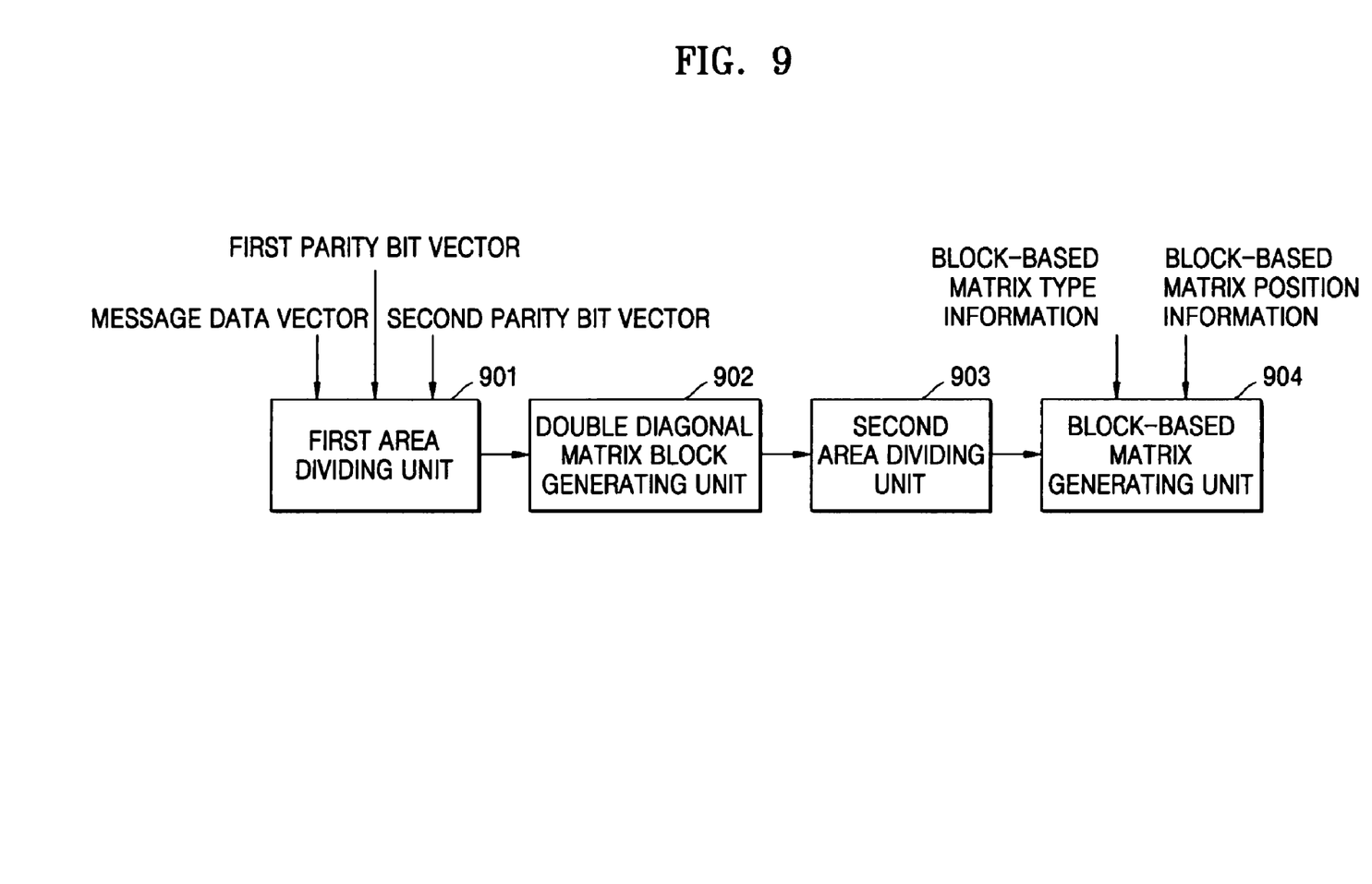
FIG. 9 is a block diagram of an apparatus for generating a block-based LDPC matrix according to an embodiment of the present invention.

FIG. 9 is a block diagram of an apparatus for generating a block-based LDPC matrix according to an embodiment of the present invention.

A first area dividing unit 901 vertically divides a predetermined area for a parity check matrix. In other words, the predetermined area is vertically divided using the length of a first parity bit vector and the length of a second parity bit vector as illustrated in FIG. 5A. However, as mentioned with reference to FIG. 4, the point 502 is determined using one of the length of the message data vector and the length of the first parity bit vector and the point 501 is determined using one of the length of the first parity bit vector and the length of the second parity bit vector, thereby vertically dividing the area for the parity check matrix into three horizontally adjacent areas.

A double diagonal matrix block generating unit 902 generates a block-based matrix such that a double diagonal matrix is arranged in an upper portion of an area corresponding to the second parity bit vector in the area for the parity check matrix, which is vertically divided by the first area dividing unit 901. In other words, the block-based matrix is generated such that the double diagonal matrix is arranged as described in operation 402 of FIG. 4.

A second area dividing unit 903 horizontally divides the area for the parity check matrix based on the position of the double diagonal matrix generated by the double diagonal matrix block generating unit 902. Thus, the area for the parity check matrix is divided into six areas as shown in FIG. 5C.

A block-based matrix generating unit 904 generates block-based matrices in the areas B, D, E, and T based on block-based matrix type and position information which is predetermined to satisfy the condition for preventing the cycle 4 phenomenon, the condition that the Richardson matrix φ is a unit matrix, and the condition that column weights (Wc) are uniform. In other words, if the areas B, D, E, and T form an 8×8 block, the block-based matrix generating unit 904 generates block-based matrices based on the predetermined block-based matrix type and position information as illustrated in FIG. 5D. For example, if positions of blocks in which a double diagonal matrix is arranged are predetermined and types of the blocks in which the double diagonal matrix is arranged are unit matrix blocks, the block-based generating unit 904 generates unit matrix blocks in the predetermined positions.

The block-based matrix generating unit 904 sequentially generates block-based matrices in the areas A and C while checking the types of matrix blocks that are already generated in the areas A and C to satisfy the condition for preventing the cycle 4 phenomenon, the condition that the Richardson matrix φ is a unit matrix, and a condition that column weights (Wc) are uniform. Thus, the block-based matrix generating unit 904 generates a block-based LDPC matrix as illustrated in FIG. 5D. Since unit matrix blocks are arranged in the right-most column of the area E as illustrated in FIG. 5D, back-substitution is possible over the entire matrix area.

When using the generated LDPC matrix, the first parity bit vector and the second parity bit vector can be defined as follows.

$$P_1 = -(-ET^{-1}A+C)S \quad (7)$$

$$P_2 = -T^{-1}(AS+BP_1) \quad (8)$$

As can be understood from Equation 7, it is not necessary to calculate the inverse matrix $\phi^{-1}$.

The method of generating an LDPC matrix according to the embodiment of present invention may be embodied as computer readable code on a computer readable recording medium and can be easily developed by computer programmers skilled in the art to which this disclosure pertains. Also, the code can be stored in computer readable media and read and executed by a computer, thereby implementing the method of generating a parity check matrix and the method of generating parity information using the parity check matrix. Examples of the computer readable media include magnetic tapes, and optical data storage devices.

As described above, according to aspects of the present invention, the calculation of an inverse matrix is not necessary and back-substitution is possible over the entire matrix area in parity bit generation, which facilitates parity bit generation.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of generating a block-based low density parity check (LDPC) matrix for use in data encoding and data decoding, the method comprising:

vertically dividing the LDPC matrix, forming a first area based on a length of a first parity bit vector and a second area based on a length of a second parity bit vector;

generating a block-based matrix such that a double diagonal matrix is arranged in an upper portion of the second area;

horizontally dividing the first area into third and fourth areas and the second area into fifth and sixth areas based on a position of the double diagonal matrix; and generating block-based matrices in the third, fourth, fifth and sixth areas of the LDPC matrix, to satisfy a condition that column weights (Wc) are uniform, such that data is encoded or decoded using the LDPC matrix with the block-based matrices.

2. The method of claim 1, wherein in the generating of the block-based matrix having the double diagonal matrix, the block-based matrix is generated such that the double diagonal matrix is arranged using unit matrix blocks.

3. The method for claim 2, wherein the generating of the block-based matrices while checking types of matrix blocks generated to prevent a cycle 4 phenomenon in the another area further comprises:

determining the positions of the unit matrix blocks, the shift matrix blocks, and zero matrix blocks to prevent the cycle 4 phenomenon in a remaining area for the LDPC matrix except for the upper portion of the second area; and generating the block-based matrices based on the determined positions.

4. The method of claim 3, further comprising:

obtaining parity bits by back substitution without calculation of an inverse matrix.

5. The method of claim 1, wherein the generating of the block-based matrix having the double diagonal matrix comprises:

generating the block-based matrix such that unit matrix blocks are arranged in an upper portion of the double diagonal matrix; and generating the block-based matrix such that shift matrix blocks are arranged in a lower portion of the double diagonal matrix.

6. The method of claim 5, wherein the generating of the block-based matrices in the third, fourth, fifth and sixth areas further comprises:

determining positions of the unit matrix blocks, the shift matrix blocks, and zero matrix blocks to prevent a cycle 4 phenomenon in a remaining area for the LDPC matrix except for the upper portion of the second area; and generating the block-based matrices based on the determined positions.

7. The method of claim 6, wherein the generating of the block-based matrices in the third, fourth, fifth and sixth areas further comprises:

determining the positions of the unit matrix blocks, the shift matrix blocks, and the zero matrix blocks to satisfy a condition that a Richardson matrix (φ) is a unit matrix in the third and fourth areas.

8. The method of claim 1, wherein:

the vertically dividing of the LDPC matrix further comprises forming another area corresponding to a message data vector;

the generating of the block-based matrices in the third, fourth, fifth and sixth areas comprises:

generating the block-based matrices such that first unit matrix blocks are disposed in a right-most column of a lower portion of the second area, and one of a second unit matrix block and a first shift matrix block and a first zero matrix block alternate vertically and horizontally in a remaining area of the lower portion of the second area except for the right-most column, generating the block-based matrices such that third unit matrix blocks and second shift matrix blocks alternate horizontally in a topmost block-based row of an upper portion of the first area and a third shift matrix block is disposed in a predetermined position of a column that contains one of the second shift matrix blocks, generating the block-based matrices such that the fourth unit matrix blocks are disposed in a bottom-most row of a lower portion of the first area and a fourth shift matrix block is disposed in a position that is immediately above the left-most block in the bottom-most row; and the method further comprises generating the block-based matrices while checking types of matrix blocks generated to prevent a cycle 4 phenomenon in the another area.

9. The method of claim 8, wherein each shift matrix block is one of a +P shift matrix block or a −P shift matrix block, where P is an integer.

10. The method of claim 9, wherein P is 1.

11. The method for claim 8, wherein each first shift matrix block is a +P shift matrix block, each second and third shift matrix block is a −P shift matrix block, and each fourth shift matrix block is a +P shift matrix block.

12. An apparatus for generating a block-based low density parity check (LDPC) matrix for use in data encoding and data decoding, the apparatus comprising:
    a first area dividing unit to vertically divide an area of the LDPC matrix based on a length of a first parity bit vector and a length of a second parity bit vector;
    a double diagonal matrix block generating unit to generate a block-based matrix such that a double diagonal matrix is arranged at a position in an upper portion of an area corresponding to the second parity bit vector among areas into which the LDPC matrix is vertically divided;
    a second area dividing unit to horizontally divide the area of the LDPC matrix based on the position of the double diagonal matrix; and
    a block-based matrix generating unit to generate block-based matrices in areas into which the LDPC matrix is horizontally and vertically divided, to satisfy a condition that column weights (Wc) are uniform, such that data is encoded or decoded using the LDPC matrix with the block-based matrices.

13. The apparatus of claim 12, wherein the double diagonal matrix block generating unit generates the block-based matrix such that the double diagonal matrix is arranged using unit matrix blocks.

14. The apparatus of claim 13, wherein the block-based matrix generating unit generates the block-based matrix based on block-based type and position information that is predetermined to prevent the cycle 4 phenomenon and satisfy a condition that the Richardson matrix ($\phi$) is a unit matrix in areas corresponding to the first parity bit vector and the second parity bit vector.

15. The apparatus of claim 12, wherein the double diagonal matrix block generating unit generates the block-based matrix such that unit matrix blocks are arranged in an upper portion of the double diagonal matrix and shift matrix blocks are arranged in a lower portion of the double diagonal matrix.

16. The apparatus of claim 15, wherein the block-based matrix generating unit generates the block-based matrix based on block-based type and position information that is predetermined to prevent a cycle 4 phenomenon and satisfy a condition that a Richardson matrix ($\phi$) is a unit matrix in areas corresponding to the first parity bit vector and the second parity bit vector.

17. The apparatus of claim 16, wherein the block-based matrix generating unit generates the block-based matrices while checking types of matrix blocks that are already generated to prevent the cycle 4 phenomenon in an area corresponding to a message data vector among the areas into which the LDPC matrix is divided.

18. A computer-readable medium having stored thereon a plurality of instructions which, when executed by a processor of a computer system, cause the processor to perform a method for generating a block-based low density parity check (LDPC) matrix for use in data encoding and data decoding, the method comprising:
    vertically dividing an area of the LDPC matrix based on a length of a first parity bit vector and a length of a second parity bit vector;
    generating a block-based matrix such that a double diagonal matrix is arranged in an upper portion of an area corresponding to the second parity bit vector among areas into which the LDPC matrix is vertically divided;
    horizontally dividing the area for the LDPC matrix based on the position of the double diagonal matrix; and
    generating block-based matrices in areas into which the LDPC matrix is horizontally and vertically divided, to satisfy a condition that column weights (Wc) are uniform, such that data is encoded or decoded using the LDPC matrix with the block-based matrices.

19. The computer-readable medium of claim 18, further comprising:
    generating of the block-based matrix having the double diagonal matrix, such that the double diagonal matrix is arranged using unit matrix blocks.

20. The computer-readable medium of claim 18, wherein the method further comprises:
    generating the block-based matrix such that unit matrix blocks are arranged in an upper portion of the double diagonal matrix; and
    generating the block-based matrix such that shift matrix blocks are arranged in a lower portion of the double diagonal matrix.

21. The computer-readable medium of claim 20, wherein the method further comprises:
    determining positions of the unit matrix blocks, the shift matrix blocks, and zero matrix blocks to prevent a cycle 4 phenonomenon in a remaining area of the LDPC not included in the upper portion of the area corresponding to the second parity bit vector; and
    generating the block-based matrices based on the determined positions.

* * * * *